United States Patent [19]

Drage et al.

[11] Patent Number: 4,857,138
[45] Date of Patent: Aug. 15, 1989

[54] SILICON TRENCH ETCH

[75] Inventors: David J. Drage, Sebastopol, Calif.; Toufic Safi, Boston, Mass.

[73] Assignee: Tegal Corporation, Petaluma, Calif.

[21] Appl. No.: 719,783

[22] Filed: Apr. 3, 1985

[51] Int. Cl.[4] .......................................... H01L 21/306
[52] U.S. Cl. .................................. 156/643; 156/662; 204/192.37
[58] Field of Search ............... 156/643, 662; 204/298, 204/192 E, 192.37; 152/29.1

[56] References Cited

U.S. PATENT DOCUMENTS 4,353,777 10/1982 Jacob .................................... 156/643
4,380,489  4/1983 Beivogl et al. ...................... 156/643

OTHER PUBLICATIONS

"Anisotropic Plasma Etching of Polysilicon Using SFL and CFCl$_3$", Mieth et al., 1983 Plasma Seminar Proceedings, pp. 25-29.

"Parameteric Modeling of Plasma Etching Processes", Sawin et al., 1985, Plasma Seminar Proceedings, pp. 17-24.

Primary Examiner—Kenneth M. Schor
Attorney, Agent, or Firm—Paul F. Wille

[57] ABSTRACT

An improved method is disclosed for obtaining relatively deep (6 microns) trenches in single crystal silicon wafers. The method comprises exposing the wafer to a plasma formed in a gas mixture comprising Freon 11 (CCl$_3$F), sulphur hexafluoride (SF$_6$) and either helium or argon. The etch takes place at a pressure of 1-3 torr (133-400 Pa) in a narrow gap (6 mm.) planar plasma reactor.

6 Claims, 1 Drawing Sheet

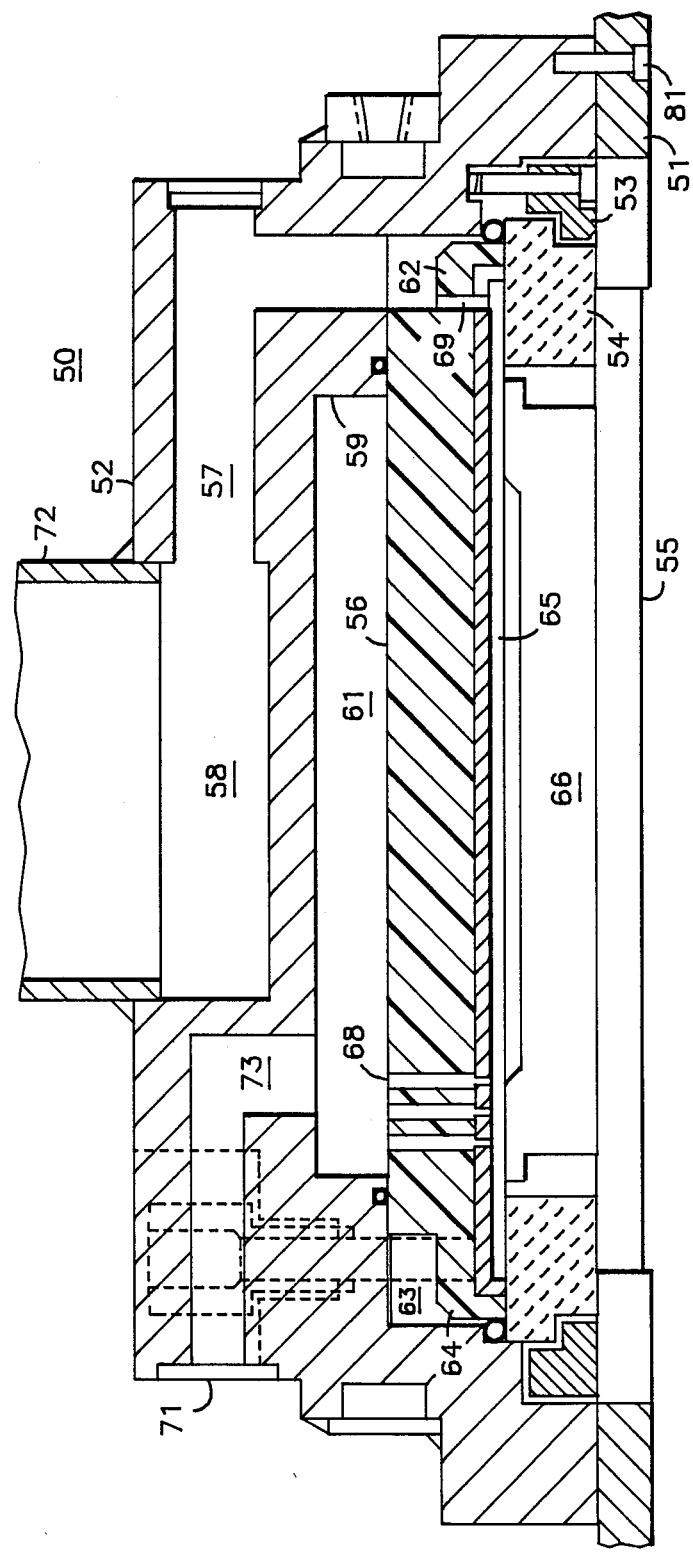

4,857,138

SILICON TRENCH ETCH

BACKGROUND OF THE INVENTION

This invention relates to plasma etch prcesses and, in particular, to a process for forming deep trenches in monocrystalline silicon.

It is well known in the art to isolate devices by way of a trench surrounding the devices. It is also known that this trench can be formed using plasma etching techniques. While shallow grooves are suitable for bipolar or dynamic memory applications, deeper grooves are necessary for MOS applications. It is desired that these grooves not only be deeper, but have vertical or nearly vertical sidewalls and be relatively uniform in depth. For shallow grooves, e.g. two to three microns deep, these criteria are more easily met than for deep grooves, e.g. five or more microns in depth. Further, it is desired that the etch time not double or triple for a groove two or three times as deep.

It is important that the grooves have vertical or nearly vertical sidewalls since devices have already been formed on the wafer. The spacing of the devices is often critical. Thus, the groove or well should not change size, shape, or position with depth. This discussed in some contexts as "loss of critical dimension." In other contexts, it may be referred to as "constant image transfer" during a process.

A considerable variety of gases have been proposed for use in plasma reactors. Various noble or other elemental gase, methanes, ethanes, and gaseous compounds, typically halides, have been used. The particular gas or gas mixture chosen is determined empirically, depending in part on the composition of the wafer to be treated. Even so, the results produced often vary with the equipment being used. For example, the results obtained from a barrel reactor may not be the same as those produced in a parallel plate reactor.

It is known in the art to use a mixture of Freon 11 ($CFCl_3$) and helium in a plasma etch reactor, e.g. see U.S. Pat. No. 4,353,777. It is also known to use a mixture of sulphur hexafluoride and helium in a plasma reactor, e.g. see U.S. Pat. No. 4,380,489. Both of these patents describe wide gap, parallel plate reactors. Further, the etch rate, for polysilicon, is a maximum of 0.74 microns per minute in patent '777 and 0.13 microns per minute in patent '489.

In view of the foregoing, it is therefore an object of the present invention to provide an improved process for etching silicon.

Another object of the present invention is to provide a process for rapidly etching trenches in silicon.

A further object of the present invention is to provide an improved etch process for narrow gap, parallel plate reactors.

SUMMARY OF THE INVENTION

The foregoing objects are achieved in the present invention wherein a mixture comprising Freon 11 and helium or Freon 11, sulphur hexafluoride, and helium is used in a narrow gap, parallel plate reactor at a pressure in excess of one torr and a power density in excess of one watt per square centimeter.

BRIEF DESCRIPTION OF THE DRAWINGS

A more complete understanding of the present invention can be obtained by considering the following detailed description in conjunction with the accompanying drawings, in which:

The FIGURE illustrates a narrow gap, parallel plate, plasma reactor.

DETAILED DESCRIPTION OF THE INVENTION

As illustrated in the figure, reactor 50 comprises a frame 51 to which the chamber body or shell 52 is attached by way of a plurality of fastening means such as bolt 81. Within shell 52 a plurality of passageways 57 communicate with a central plenum 58 through which gases are typically exhausted by member 72 which is connected to a suitable vacuum pump. Also, within shell 52, is passageway 73 which communicates to the outside of shell 52 by way of fitting 71. A source of one or more gases is connected to fitting 71. Alternately, a plurality of passageways 73 can be provided so that the interior of shell 52 acts as a mixing chamber.

Shell 52 forms a broad, shallow counterbore having shoulder 59. Upper electrode 56 abutts shoulder 59 to form plenum 61 within chamber 52. Electrode 56 is held in placed by isolation ring 54. Retaining ring 53 is attached to shell 52, fastening both electrode 56 and isolation ring 54. Upper electrode 56 comprises a plurality of bores such as bores 68 which communicate from one major surface of electrode 56 to the other in a predetermined pattern across the central area of electrode 56. The lower surface of electrode 56, in turn, preferably comprises a large shallow counterbore defined as annular shoulder 64 which determines the spacing between the facing major surfaces of electrode 56 and lower electrode 55. Lower electrode 55 includes wafer chuck 66 for receiving the wafer to be processed. The upper surface of chuck 66 is recessed so that the surface of the wafer to be treated is approximately co-planar with the rest of the electrode.

When the reactor is closed, i.e. when lower electrode 55 is positioned as shown, chamber 65 is formed above the lower electrode and is the volume in which the plasma is formed. The gap between the electrodes, ignoring the recess in chuck 66, is small; typically from 3 to 10 millimeters.

Around the peripheral portion of electrode 56 is formed a plurality of bores 69 which communicate with passage way 57. The periphery of electrode 56 is of reduced thickness to form an annular chamber 63 between shoulder 62 and shell 52. Annular chamber 63 communicates by way of passage way 57 with plenum 58.

In operation, a wafer is loaded into chuck 66 and raised into position on the lower electrode, thereby closing chamber 65. Gas is applied to fitting 71 and run through the system to purge it of other gases. As an example of a preferred embodiment of the present invention, the gas comprises:

| | | |
|---|---|---|
| 15 SCCM | $CCl_3F$ | (Freon 11) |
| 6 SCCM | $SF_6$ | |
| 25 SCCM | He | | at a total pressure of 1.0 torr (133 Pa). An RF signal at 13.56 MHz and 450 watts is applied for approximately two and one-half minutes. The result is a trench 4.5 microns deep having nearly vertical walls and good uniformity. A similar, but deeper, trench is obtained by continuing the etch for a longer time. After several wafers are etched, it is desirable to run the reactor empty in a cleaning cycle to remove any coatings which may have formed on exposed, grounded metal parts.

Table I below lists for examples of processes in acordance with the present invention. Table II below lists the corresponding results of these processes. Non-uniformity is defined as surface (not trench) high minus surface low divided by twice the average etch rate, times one hundred. Selectively is the ratio of the etch rates of silicon and the mask layer ($SiO_2$). Divergence is a measure of variation from an imaginary vertical line representing the sidewall resulting from a perfectly anisotropic etch. The etch may produce a trench whose cross-section tapers inwardly, tapers outwardly (undercuts), or bows (slopes outwardly at the top, inwardly at the bottom). In general, increasing the proportion of the inert gas reduces the etch rate of silicon and increasing the proportion of the $SF_6$ increases the etch rate, although this also increases the amount of polymer deposited on the chamber walls. Increasing Freon 11 content increases anisotropy and uniformity.

TABLE I

| PROCESS | $CCl_3F$ (sccm) | $SF_6$ (sccm) | Ar (sccm) | He (sccm) | PRESSURE TOTAL (torr) | POWER |
|---|---|---|---|---|---|---|
| 1 | 20 | 5 | 0 | 25 | 2.0 | 400 CW |
| 2 | 25 | 0 | 0 | 35 | 1.5 | 500 CW |
| 3 | 15 | 6 | 0 | 25 | 1.0 | 450 CW |
| 4 | 15 | 6 | 25 | 0 | 1.0 | 550 CW |

TABLE II

| PROCESS | SILICON ETCH RATE ($\mu$/min) | DIVERGENCE (nm) | NONUNIFORMITY (%) | Si:$SiO_2$ SELECTIVITY | TRENCH DEPTH ($\mu$) |
|---|---|---|---|---|---|
| 1 | 2.9 | 400 | 7 | 11:1 | 11.0 |
| 2 | 1.0 | 350 | 2 | 8:1 | 3.5 |
| 3 | 1.75 | 500 | 7 | 5.7:1 | 4.5 |
| 4 | 1.6 | 300 | 8 | 5.2:1 | 3.2 |

Thus, the present invention provides a process for rapidly forming trenches in silicon. The production rate is not adversely affected by the depth of the trench due to the increased etch rate. In addition, the trenches are well formed and suitable for use in making dielectrically isolated devices.

Having thus described the present invention, it is apparent to those of skill in the art that various modifications can be made within the spirit and scope of the present invention. The Freon 11 content of the gas cannot be increased arbitrarily. Since the amount of inert gas should equal or exceed the amount of Freon 11, there can be no more than fifty percent Freon 11 in the gas mixture. The amount of inert gas should equal or exceed the amount of Freon 11 whether or not additional components are present, i.e. the gas mixture supplied to the reactor need not be fifty percent or more inert gas.

We claim:

1. A plasma trench etch process comprising the steps of:

enclosing a silicon substrate in a plasma reactor having an electrode gap of 3-10 mm;

providing a gas mixture, comprising $CCl_3F$ and an inert gas wherein the amount of $CCl_3F$ is less than the amount of inert gas, at a pressure of from 1.0 to 5.0 torr;

applying an RF signal, at a power in excess of 400 watts, to said reactor for forming a plasma within said reactor; and continuing said process for a period sufficient to etch said silicon substrate.

2. The process as set forth in claim 1 wherein said gas mixture further comprises $SF_6$ in an amount less than said $CCl_3F$.

3. The process as set forth in claim 2 wherein said wafer is enclosed in a reactor having an electrode gap of 6 millimeters.

4. The process as set forth in claim 2 wherein said inert gas comprises helium.

5. The process as set forth in claim 2 wherein said inert gas comprises argon.

6. The process as set forth in claim 1 wherein said inert gas comprises helium.

* * * * *